United States Patent
Starkovich et al.

(10) Patent No.: US 11,488,889 B1
(45) Date of Patent: Nov. 1, 2022

(54) SEMICONDUCTOR DEVICE PASSIVE THERMAL MANAGEMENT

(71) Applicant: Northrop Grumman Systems Corporation, Falls Church, VA (US)

(72) Inventors: John A. Starkovich, Redondo Beach, CA (US); Jesse B. Tice, Torrance, CA (US); Vincent Gambin, Torrance, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 4 days.

(21) Appl. No.: 15/671,432

(22) Filed: Aug. 8, 2017

(51) Int. Cl.
H01L 23/373 (2006.01)

(52) U.S. Cl.
CPC ...... H01L 23/3735 (2013.01); H01L 23/3736 (2013.01)

(58) Field of Classification Search
CPC .................. H01L 23/3735; H01L 23/3736
USPC .................................................. 257/625–631
See application file for complete search history.

(56) References Cited

U.S. PATENT DOCUMENTS

| | | | |
|---|---|---|---|
| 4,602,965 A * | 7/1986 | McNally | H01L 21/2654 438/520 |
| 5,047,365 A * | 9/1991 | Kawanaka | H01L 21/02395 117/90 |
| 5,660,917 A | 8/1997 | Fujimori et al. | |
| 6,773,952 B2 | 8/2004 | Armbrust et al. | |
| 8,575,657 B2 | 11/2013 | Gambin et al. | |
| 8,908,383 B1 | 12/2014 | Railkar et al. | |
| 2001/0030316 A1 * | 10/2001 | Kuramoto | H01L 33/32 257/12 |
| 2004/0113231 A1 * | 6/2004 | Hoag | H01L 23/3171 257/528 |
| 2008/0303157 A1 * | 12/2008 | Cheng | H01L 33/641 257/758 |
| 2013/0248879 A1 | 9/2013 | Gambin et al. | |
| 2015/0056763 A1 | 2/2015 | Hobart et al. | |
| 2015/0362265 A1 | 12/2015 | Broido et al. | |

FOREIGN PATENT DOCUMENTS

JP    2000022211 A  * 1/2000

OTHER PUBLICATIONS

JP 200022211 A—Machine Translation.*
Lindsay et al., First-Principles Determination of Ultrahigh Thermal Conductivity of Boron Arsenide: A Competitor for Diamond? (Jul. 12, 2013), Physical Review Letters, 111, 025901, pp. 1-5 (Year: 2013).*

(Continued)

*Primary Examiner* — Ori Nadav
(74) *Attorney, Agent, or Firm* — McCracken & Gillen LLC

(57) ABSTRACT

Cubic BAs is used in semiconductors to improve the thermal characteristics of a device. The BAs is used in device layers to improve thermal conductivity. The BAs also provides thermal expansion characteristics that are compatible with other semiconductors and thereby further improves reliability. The substrates of the semiconductors may also include vias that contain BAs. The BAs in the vias may contact the BAs in the device layers. Some vias may have a surface area to volume ratio of greater than 10 to better assist with device heat dissipation.

20 Claims, 8 Drawing Sheets

(56) References Cited

OTHER PUBLICATIONS

Broido et al. ("Ab initio study of the unusual thermal transport properties of boron arsenide and related materials", Physical Review B 88, 214303 (2013), pp. 214303-1-214303-12, published Dec. 11, 2013). (Year: 2013).*

APA Citation; An unlikely competitor for diamond as the best thermal conductor; Phys Org; Jul. 8, 2013; http://phys.org/news/2013-07-competitor-diamond-thermal-conductor.html.

Lindsay, L. et al; First-Principles Determination of Ultrahigh Thermal Conductivity of Boron Arsenide: A Competitor for Diamond?; Physics; Physical Review Letters; PRL 111, 025901, American Physical Society 2013; Published Jul. 8, 2013; pp. 025901-1 thru 025901-5.

Lv, B. et al; Experimental study of the proposed super-thermal-conductor: BAs; Applied Physics Letters 106, No. 7 (2015): 074105; doi: 10.1063/1.4913441.

Evans, D.A.; Applications of bis (imino) acenaphthene and investigation of boron arsenide as a high thermal conductivity materia; University of Texas, Austin, PhD dissertation; 2015, Chapter 3, pp. 193-218.

Certified copy of a full translation of Terajima, Publication No. JP2000-022211A, dated Jan. 2000 from Japanese to English; Feb. 4, 2019.

\* cited by examiner

SEMICONDUCTOR DEVICE PASSIVE THERMAL MANAGEMENT

TECHNICAL FIELD

An embodiment of the present invention relates to the field of semiconductor devices, more particularly, to semiconductor device thermal management.

BACKGROUND

Next generation smaller feature size microelectronic devices (e.g. GaN HEMT on SiC) are expected to operate at hot-spot or junction level power densities >30,000 W/cm2 or 3× that of the sun. Heat dissipation for these devices becomes the overwhelming factor governing their reliability and operational performance. During operation a large portion of the temperature rise occurs in the substrate due to its thermal resistance. Despite the high thermal conductivity of SiC, the thermal resistance of the substrate still limits the performance of power amplifiers. Junction temperature rise and its impact on reliability is the main factor limiting the output power for GaN HEMT devices.

Active thermal management systems such as thermoelectric elements, micro-channel liquid coolants and heat pipes are all being actively investigated for high power density device applications. These active systems are complex, expensive and have low reliability.

SUMMARY

Several embodiments of the present invention provide improved semiconductor thermal management using passive cooling that is less complex, less expensive and more reliable than active thermal management systems. Overall semiconductor device reliability and performance is further improved by, for example, the thermal conductivity of materials used, the arrangement of the materials used and the coefficient of thermal expansion of materials used.

An embodiment of the present invention comprises a semiconductor device with a substrate having a top surface and a bottom surface, a first boron arsenide (BAs) electrically insulating layer, a device buffer layer, and a device channel layer on top of the device buffer layer. The device buffer layer is between the top surface of the substrate and the device channel layer, and the BAs electrically insulating layer is in thermal contact with the device buffer layer and the device channel layer. The BAs layer provides excellent thermal conductivity and may be, for example, a cubic BAs layer.

In another embodiment of the present invention, the BAs electrically insulating layer is in direct contact with the device channel layer.

In yet another embodiment of the present invention, the BAs electrically insulating layer is in direct contact with the device buffer layer and the top surface of the substrate.

In still another embodiment of the present invention, the substrate comprises at least one via through the bottom surface and into the substrate, and the at least one via contains BAs.

In another embodiment of the present invention, the BAs in the at least one via contacts the BAs electrically insulating layer.

In yet another embodiment of the present invention, the bottom surface of the substrate has a BAs electrically insulating layer.

In still another embodiment, the present invention comprises a semiconductor device with a first layer having a first layer conductive contact and being doped at a first concentration of a first dopant type, the first dopant type being one of a P type or a N type dopant, and a second layer on top the first layer and being doped at a second concentration of the first dopant type, the second concentration being less than the first concentration, and a third layer on top of the second layer and having a third layer conductive contact and being doped with a second dopant type, the second dopant type being one of the P type or the N type dopants, and being a different dopant type than the first dopant type, and a fourth layer on top of the third layer and having a fourth layer conductive contact and being doped with the first dopant type, wherein at least one of the first and second layers is a BAs layer. The BAs layers provide excellent thermal conductivity and may be, for example, cubic BAs layers.

In yet another embodiment of the present invention a BAs electrically insulating layer is in contact with the first layer, the second layer, the third layer and the fourth layer.

DETAILED DESCRIPTION

Figure 1:
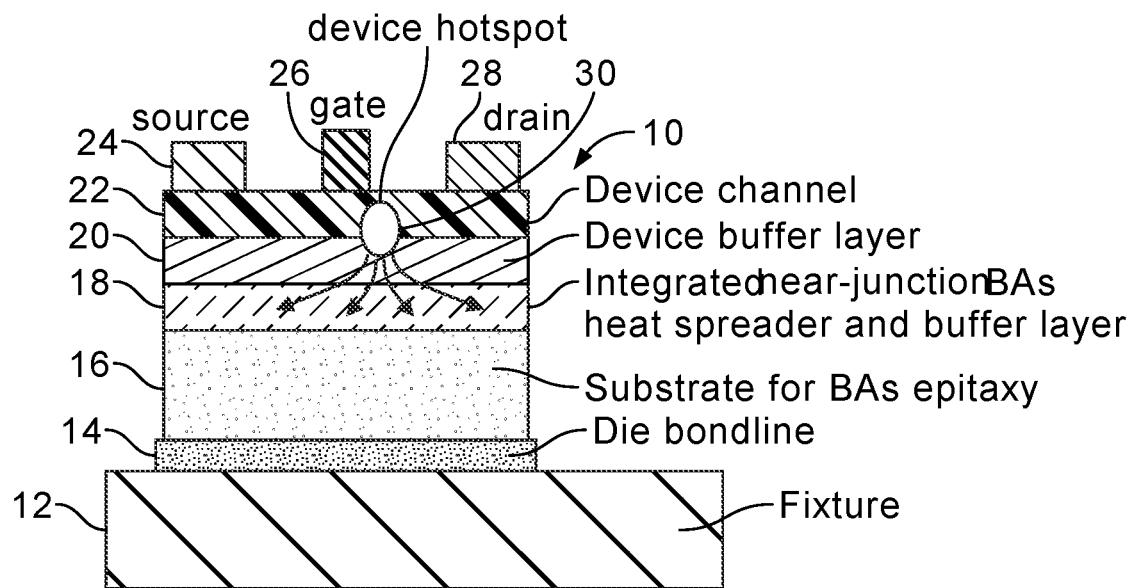
FIG. 1 illustrates an embodiment with a FET and a BAs layer between the top of the substrate and the device buffer layer.

FIG. 1 illustrates an embodiment of the present invention involving a Field Effect Transistor (FET). The figure illustrates a cross-section of a FET. FET 10 is mounted to fixture 12. Fixture 12 may be made of, for example, any machineable low resistance metal such as Kovar, A40, CuW, or even Al or Cu. FET 10 is mounted to fixture 12 through die bondline 14. Die bondline 14 may be made of, for example, metal eutectic solders or epoxies. The layer of FET 10 mounted to die bond line 14 is substrate 16. Substrate 16 may be made from, for example, semi-insulating materials such as BAs, sapphire, GaAs or InP. Theses substrates are usually single crystal materials grown via traditional crystal growth techniques and polished or grown/deposited as epitaxal films. They may be, for example, pulled from a melt or vapor deposited using seed crystals. Positioned above substrate 16 is BAs electrically insulating layer 18. Layer 18 may be in direct contact with the top surface of substrate 16 and may be epitaxially deposited on layer 16. Layer 18 may be grown by, for example, chemical vapor deposition (CVD) or by molecular-beam epitaxy (MBE). Layer 18 may be cubic BAs. Positioned above and in direct contact with layer 18 is device buffer layer 20. Device buffer layer 20 may be epitaxially deposited on layer 18 and may, for example, provide a better lattice match for the device channel layer. Layer 20 may be formed by, for example, CVD, MBE or liquid phase epitaxy (LPE). Device buffer layer 20 may be fabricated using for example, a compound semiconductor buffer layer such as InAlAs, InP, AlGaAs, GaN or AlGaN. Device channel layer 22 is fabricated on top of device buffer layer 20. Device channel layer 22 may be epitaxially deposited on layer 20. Layer 22 may be formed by, for example, CVD, MBE or LPE. Layer 22 is fabricated with the appropriate P type and N type doping materials to create a P-channel or an N-channel device. Conductive contacts 24 and 28, and electrode 26 are placed in contact with the appropriate portions of device channel layer 22 as is well known in the design of FETs. Contacts 24 and 28 and electrode 26 may be made of, for example, titanium, aluminum, chromium, copper or gold.

An example of a hot-spot in FET 10 is illustrated by hot-spot 30. Layer 18 is in thermal contact with layers 16, 20 and 22. The heat from hot-spot 30 is spread through the high thermal conductivity of layer 18. This helps to remove heat from layers 22 and 20, and into substrate 16 and eventually fixture 12 to keep FET 10 cooler and thereby improve reliability and performance.

Figure 2:
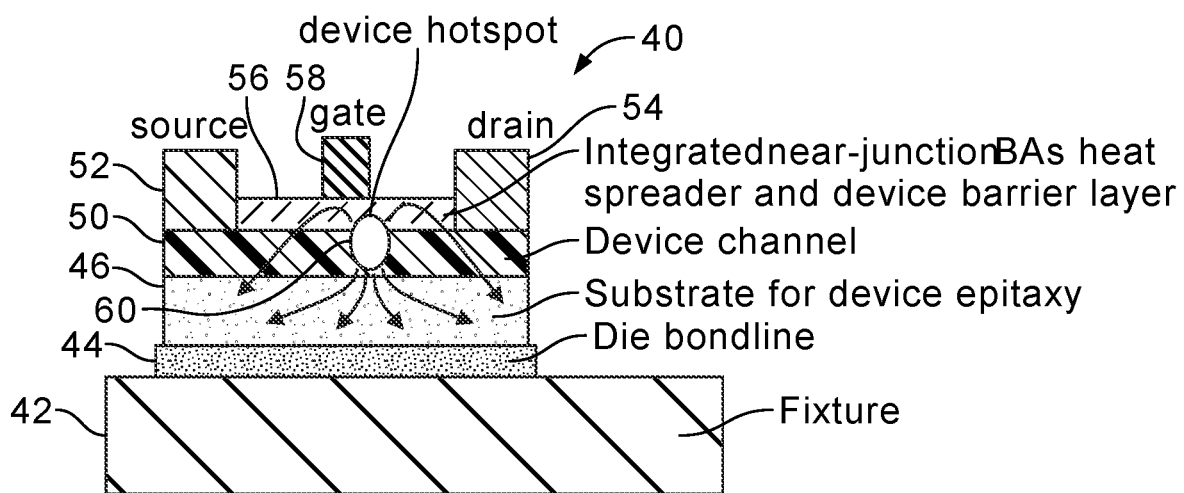
FIG. 2 illustrates an embodiment with a FET and a BAs layer on top of the device channel layer.

FIG. 2 illustrates an embodiment of the present invention involving a FET. The figure illustrates a cross-section of the FET. FET 40 is mounted to fixture 42 through die bondline 44. Fixture 42 and die bondline 44 are similar to the corresponding structures discussed regarding FIG. 1. In this embodiment, a device buffer layer is not illustrated because in this example, there is a near lattice match between the substrate and device channel layer. If a closer lattice match is desired, a device buffer layer may be used to improve lattice match with the device channel layer. Substrate layer 46 is mounted on top of die bondline 44. Substrate 46 may be made from, for example, semi-insulating materials such as BAs, sapphire, GaAs or InP. Theses substrates are usually single crystal materials grown via traditional crystal growth techniques and polished or grown/deposited as epitaxal films. They may be, for example, pulled from a melt or vapor deposited using seed crystals. Device channel layer 50 is fabricated on top of layer 46. Device channel layer 50 may be epitaxially deposited on layer 46. Layer 50 may be formed by, for example, CVD, MBE or LPE. Device channel layer 50 may be fabricated with the appropriate P type and N type doping materials to create a P-channel or an N-channel device. Electrical contacts 52 and 54 are in electrical contact with layer 50, and may be made of, for example, titanium, aluminum, chromium, copper or gold. BAs electrically insulating layer 56 is formed on top of layer 50 and may be in direct contact with layer 50. Layer 56 may be cubic BAs. Layer 56 may be formed by, for example, CVD, MBE, or LPE. In addition to acting as a heat spreader, this layer also acts as a device barrier layer. Layer 56 is in thermal contact with layers 50 and 46. Electrode 58 is positioned in contact with layer 56 to affect operation of the FET, and may be made of, for example, titanium, aluminum, chromium, copper or gold.

Hot-spot 60 illustrates the heat produced by the FET. The heat is spread by layer 56 and thereby enhances heat dissipation through layers 50 and 46, and eventually to fixture 42.

Figure 3:
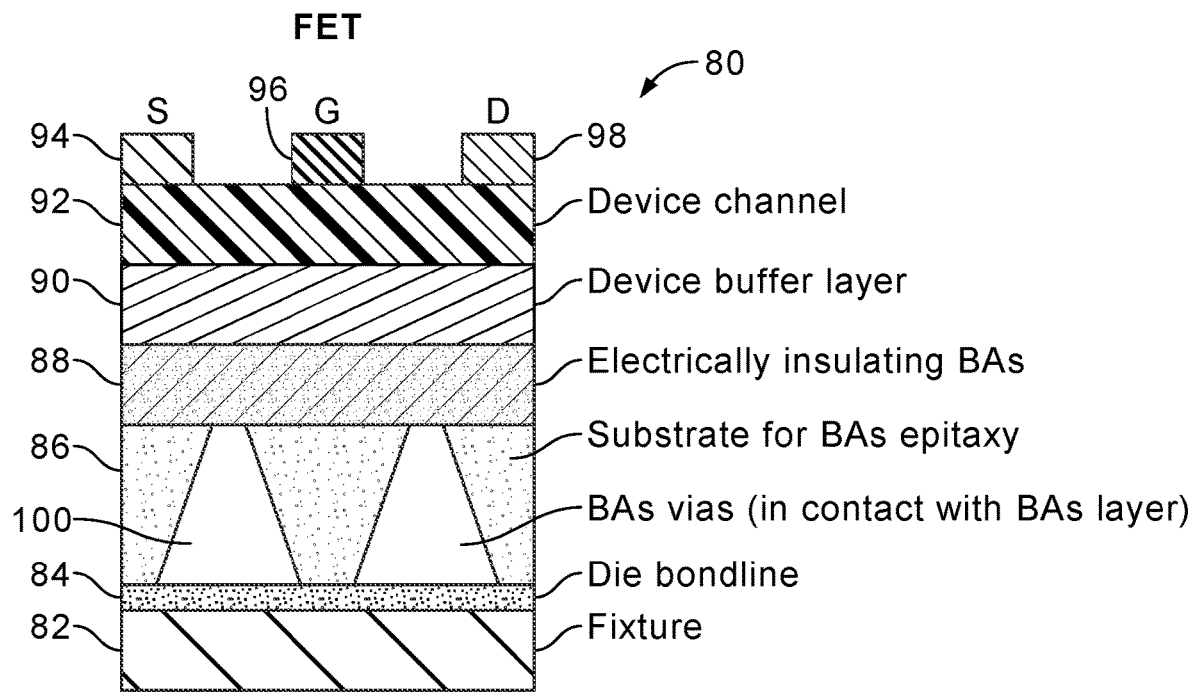
FIG. 3 illustrates an embodiment with a FET and a BAs layer between the top of the substrate and the device buffer layer with vias in the substrate.

FIG. 3 illustrates an embodiment of the present invention involving a FET. The figure illustrates a cross-section of the FET. FET 80 is mounted to fixture 82 using die bondline 84. Fixture 82 and die bondline 84 are similar to the corresponding structures discussed regarding FIG. 1. Substrate 86 may be mounted on top of die bond line 84. Substrate 86 may be made from, for example, semi-insulating materials such as BAs, sapphire, GaAs or InP. Theses substrates are usually single crystal materials grown via traditional crystal growth techniques and polished or grown/deposited as epitaxal films. They may be, for example, pulled from a melt or vapor deposited using seed crystals. Positioned above substrate 86 is BAs electrically insulating layer 88. Layer 88 may be in direct contact with the top surface of substrate 86 and may be epitaxially deposited on layer 86. Layer 88 may be grown by, for example, CVD or MBE. Layer 88 may be cubic BAs. Positioned above and in direct contact with layer 88 is device buffer layer 90. Device buffer layer 90 may be epitaxially deposited on layer 88. Device buffer layer 90 may be fabricated using for example, a compound semiconductor buffer layer such as InAlAs, InP, AlGaAs, GaN or AlGaN. Layer 90 may be formed by, for example, CVD, MBE or LPE. Device channel layer 92 is fabricated on top of device buffer layer 90. Layer 92 is fabricated with the appropriate P type and N type doping materials to create a P-channel or a N-channel device. Device channel layer 92 may be epitaxially deposited on layer 90. Layer 92 may be formed by, for example, CVD, MBE or LPE. Conductive contacts 94 and 98, and electrode 98 are placed in contact with the appropriate portions of device channel layer 92 as is well known in the design of FETs. Contacts 94 and 98, and electrode 96 may be made of, for example, titanium, aluminum, chromium, copper or gold.

Substrate layer 86 includes vias 100. Vias 100 are etched into substrate 86 from the bottom surface of the substrate and into the substrate. The vias may extend partially into substrate 86 or they may extend through substrate 86 in order to contact layer 88. Vias 100 contain BAs. BAs may be cubic BAs. The BAs in vias 100 may for example, coat the inner surfaces of the vias, partially fill the vias or completely fill the vias. The BAs in the vias may contact the BAs of layer 88. It is also possible to coat the bottom surface of substrate 86 with BAs and to have the BAs on the bottom surface of substrate 86 contact the BAs in vias 100. The BAs on the bottom surface of substrate 86 may be cubic BAs. Layer 88 is in thermal contact with layers 90 and 92 thereby provides a path for heat dissipation from layers 90 and 92 through vias 100 and eventually to fixture 82.

Figure 4:
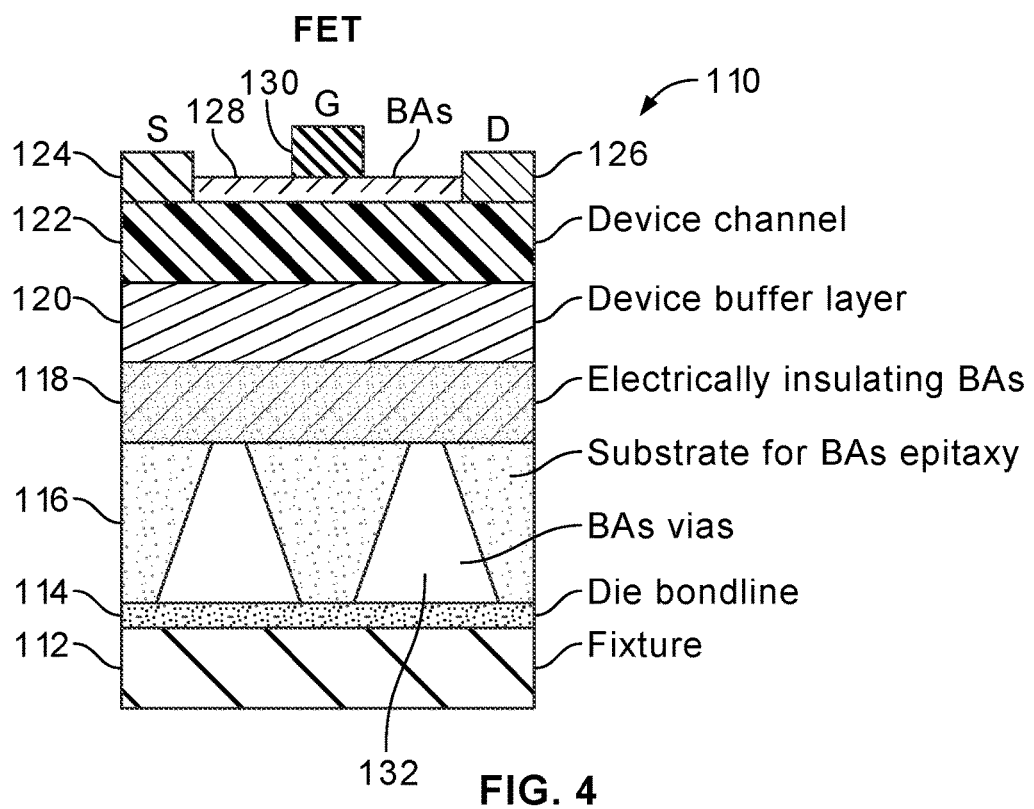
FIG. 4 illustrates an embodiment with a FET and a BAs layer between the top of the substrate and the device buffer layer, and on top of the device channel layer with vias in the substrate.

FIG. 4 illustrates an embodiment of the present invention involving a FET. The figure illustrates a cross-section of the FET and is similar to FIG. 3. FET 110 is mounted to fixture 112 by die bondline 114. Substrate layer 116 of FET 110 is mounted to die bondline 114. Substrate 116 may be made from, for example, semi-insulating materials such as BAs, sapphire, GaAs or InP. Theses substrates are usually single crystal materials grown via traditional crystal growth techniques and polished or grown/deposited as epitaxal films. They may be, for example, pulled from a melt or vapor deposited using seed crystals. Positioned above substrate 116 is BAs electrically insulating layer 118. Layer 118 may be in direct contact with the top surface of substrate 116 and may be epitaxially deposited on layer 116. Layer 118 may be grown by, for example, CVD or MBE. Layer 118 may be cubic BAs. Positioned above and in direct contact with layer 118 is device buffer layer 120. Device buffer layer 120 may be epitaxially deposited on layer 118. Device buffer layer 120 may be fabricated using for example, a compound semiconductor buffer layer such as InAlAs, InP, AlGaAs, GaN or AlGaN. Layer 120 may be formed by, for example, CVD, MBE or LPE. Device channel layer 122 is fabricated on top of device buffer layer 120. Layer 122 is fabricated with the appropriate P type and N type doping materials to create a P-channel or an N-channel device. Device channel layer 122 may be epitaxially deposited on layer 120. Layer 122 may be formed by, for example, CVD, MBE or LPE. Electrical contacts 124 and 126 are in electrical contact with layer 122. These contacts may be made of, for example, titanium, aluminum, chromium, copper or gold. BAs electrically insulating layer 128 is formed on top of layer 122 and may be in direct contact with layer 122. Layer 128 may be cubic BAs. In addition to acting as a heat spreader, this layer also acts as a device barrier layer. Layer 128 is in thermal contact with layers 122, 120 and 118. Layer 128 may be formed by, for example, CVD, MBE, or LPE. Electrode 130 is positioned in contact with layer 128 to affect operation of the FET. Electrode 130 may be made of, for example, titanium, aluminum, chromium, copper or gold.

Substrate layer 116 includes vias 132. Vias 132 are etched into substrate 116 from the bottom surface of the substrate and into the substrate. The vias may extend partially into substrate 116 or they may extend through substrate 116 in order to contact layer 118. Vias 132 contain BAs. BAs may be cubic BAs. The BAs in vias 132 may for example, coat the inner surfaces of the vias, partially fill the vias or completely fill the vias. The BAs in the vias may contact the BAs of layer 118. It is also possible to coat the bottom surface of substrate 116 with BAs and to have the BAs on the bottom surface of substrate 116 contact the BAs in vias 132. The BAs coating the bottom surface of substrate 116 may be cubic BAs. Layer 118 is in thermal contact with layers 120 and 122 thereby provides a path for heat dissipation from layers 120 and 122 through vias 132 and eventually to fixture 112.

Figure 5B:
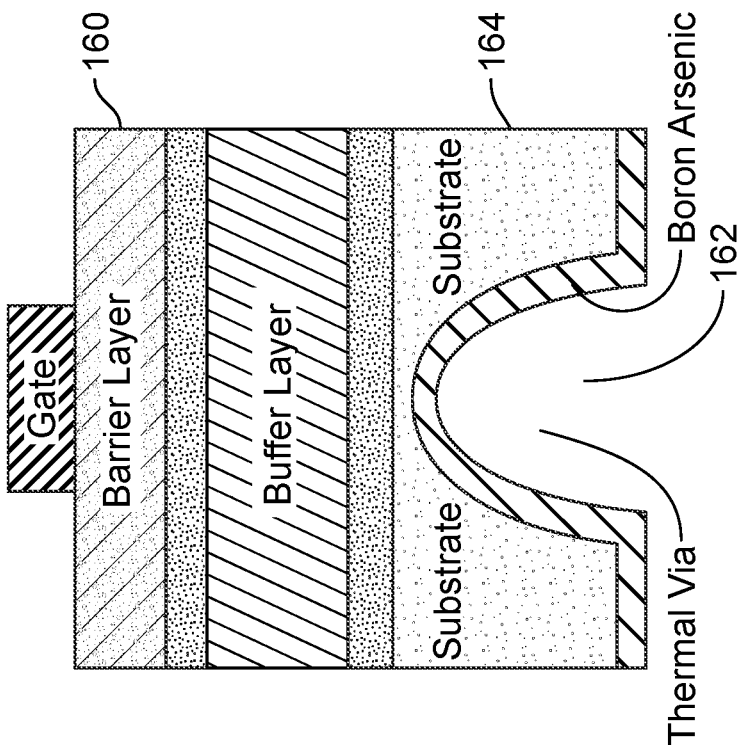
FIGS. 5A and 5B illustrate substrates with BAs vias.
Figure 5A:
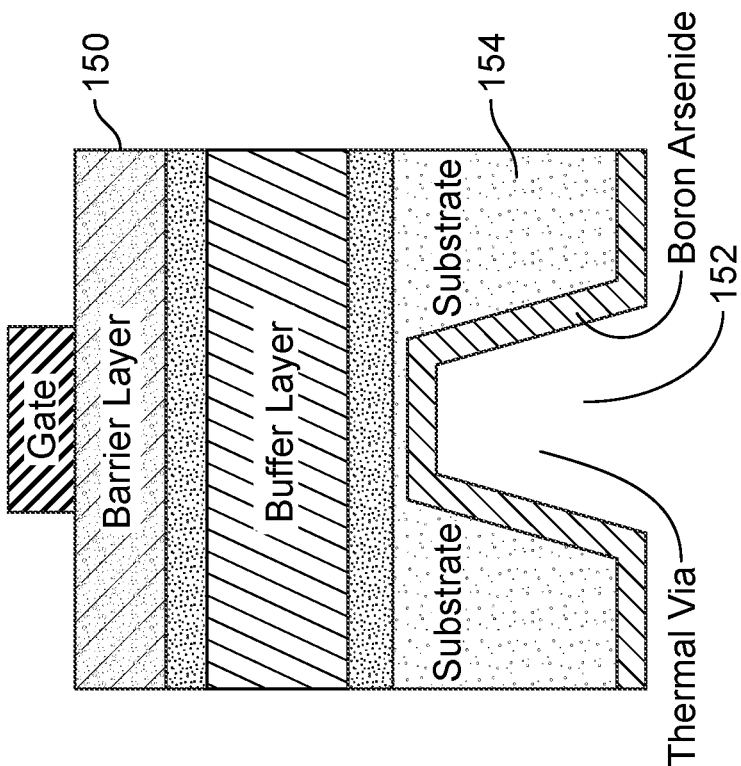

FIGS. 5A and 5B illustrate examples of semiconductor devices with vias etched in their substrate layers. The semiconductor devices of FIGS. 5A and 5B are cross-sections. Device 150 has via 152 etched into substrate layer 154. In this example, via 152 and the bottom surface substrate 154 are coated with BAs or cubic BAs. In this example, the shape of via 152 is pyramidal.

FIG. 5B illustrates semiconductor device 160. Semiconductor device 160 has via 162 etched into substrate layer 164. In this example, via 162 and the bottom surface substrate 164 are coated with BAs or cubic BAs. In this example, the shape of via 162 is paraboloidal.

It is possible to use a variety of shapes for vias. The coefficient of thermal expansion (CTE) for BAs or cubic BAs closely matches the coefficient of thermal expansion of substrates such as the substrates of FIGS. 3 and 4, and therefore supports a wide variety of via shapes. The close matching of the coefficient of thermal expansion also permits via shapes with sharper angles.

Figure 6:
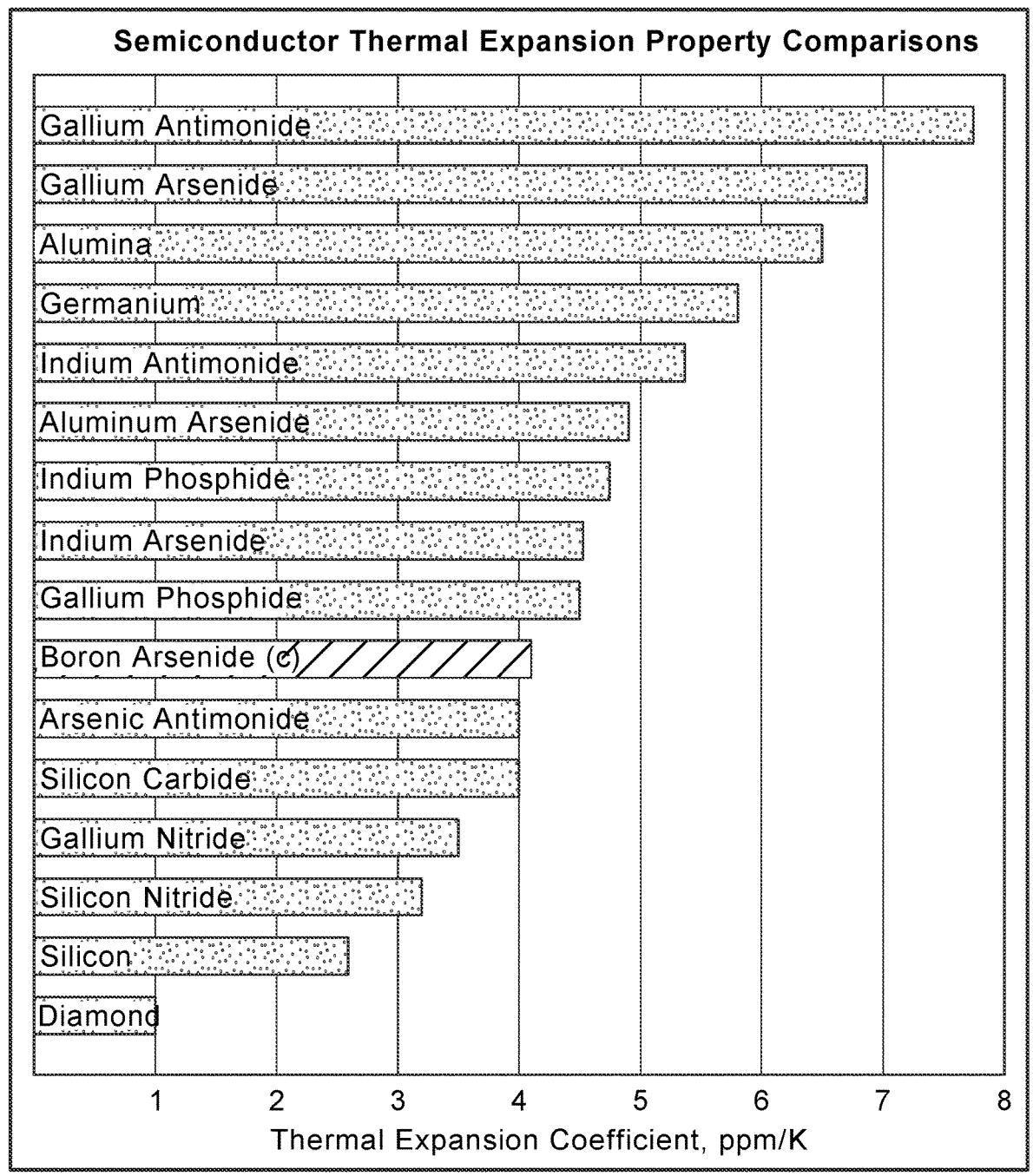
FIG. 6 illustrates a table comparing the CTEs of different materials.

FIG. 6 illustrates a table comparing the CTEs of different materials. The table shows that the CTE of cubic BAs closely matches many materials used in semiconductor fabrication. This close CTE match facilitates using a wider variety of via shapes.

Figure 7:
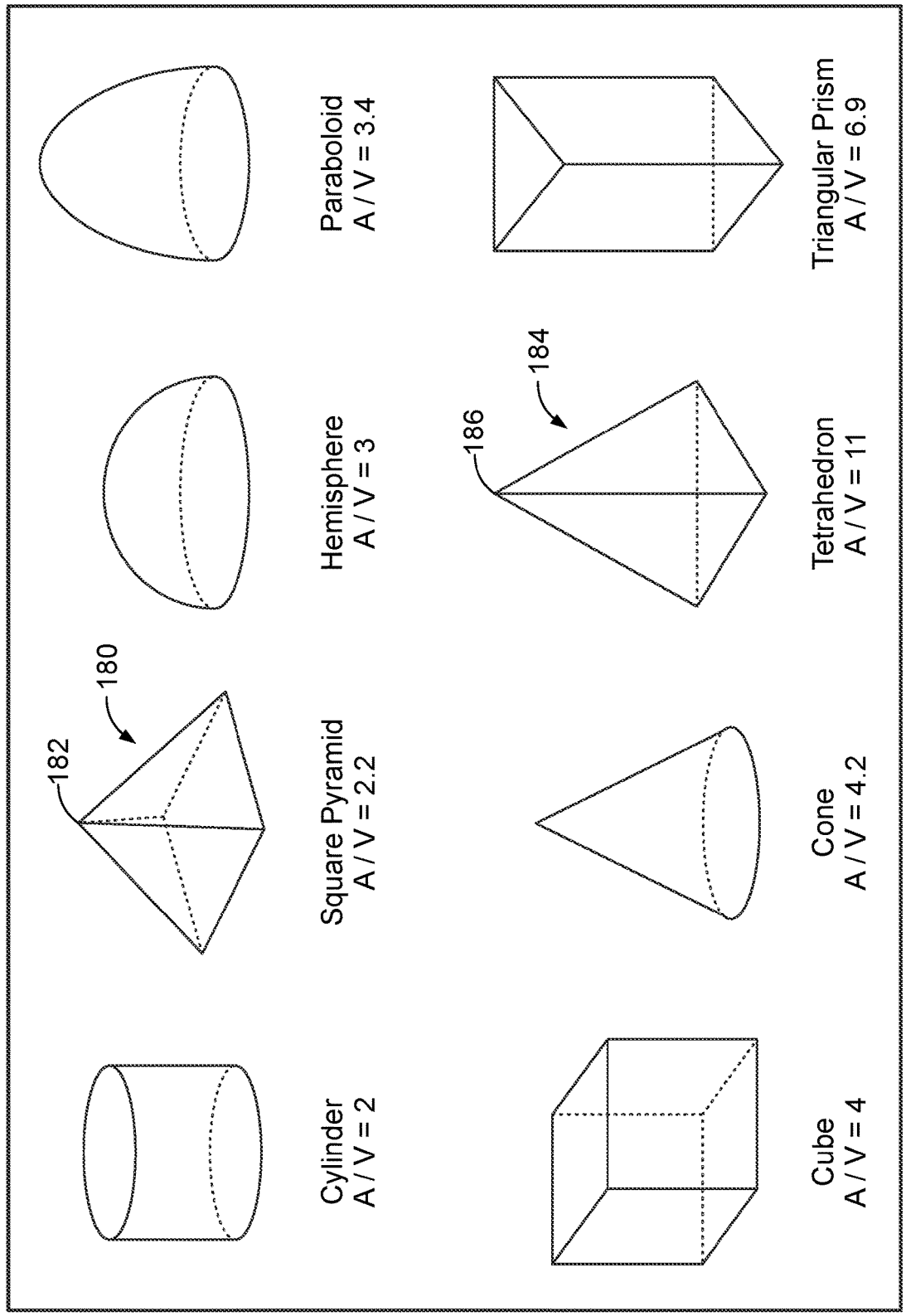
FIGS. 7A-7B illustrate examples of via shapes.
Figure 7B:
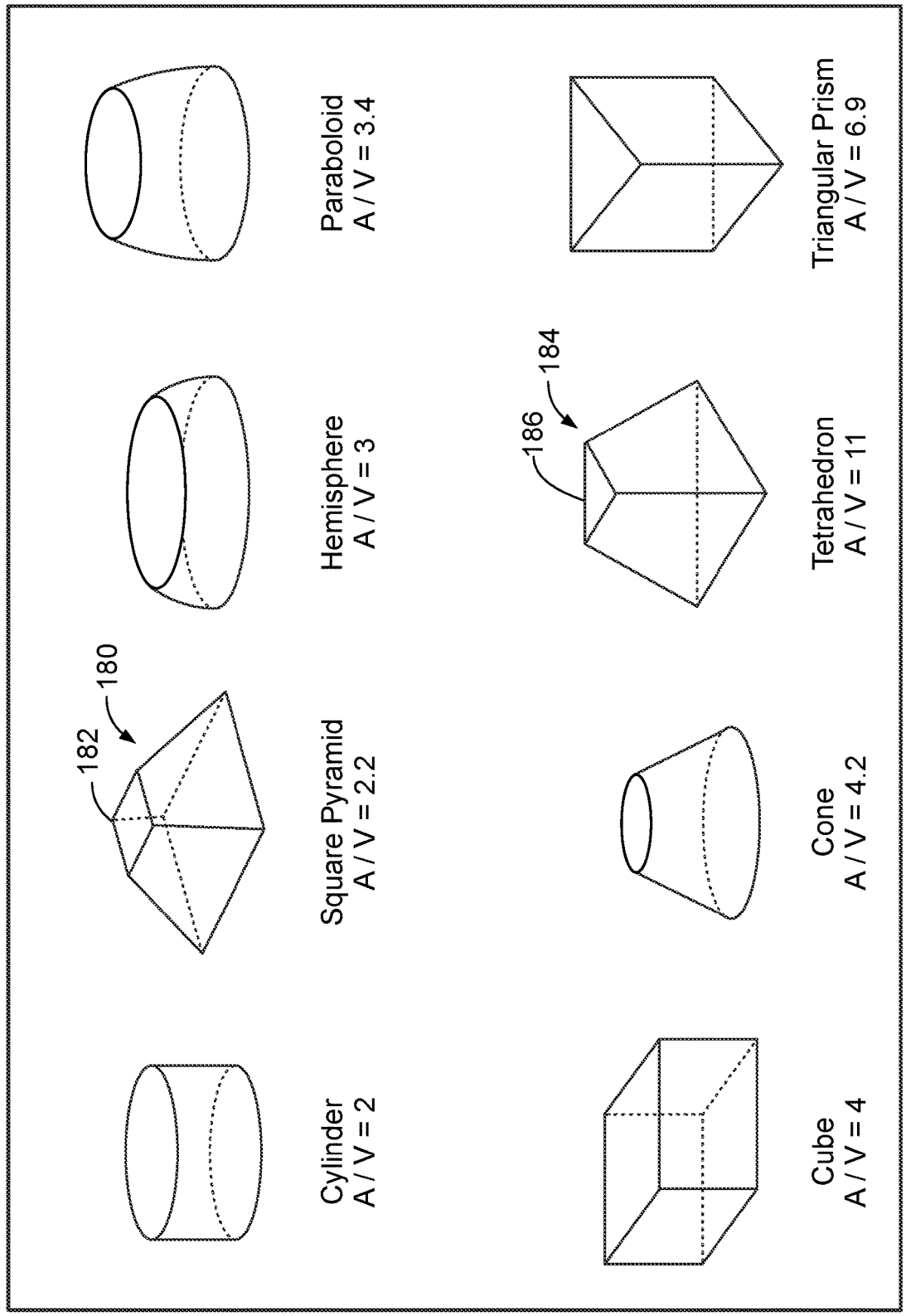

FIGS. 7A-7B illustrate examples of a variety of possible via shapes. The figures illustrate the shapes and the area to volume ratio of the particular shape. Shapes having area to volume ratios of greater than 10 provide good heat transfer. The shapes illustrated in FIG. 7A may also be modified to use truncated versions, which are illustrated in FIG. 7B. For example, a truncated version of FIG. 7A's square pyramid 180 would involve, as depicted in FIG. 7B, flattening apex 182. Similarly, a truncated version of FIG. 7A's tetrahedron 184 would involve, as depicted in FIG. 7B, flattening apex 186.

Figure 8:
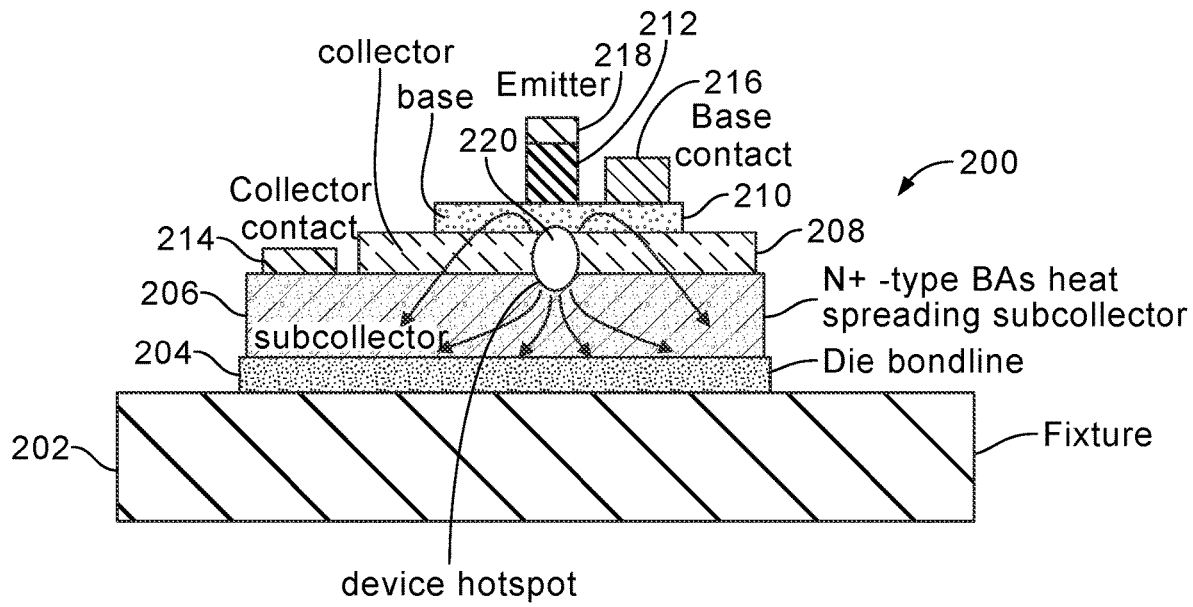
FIG. 8 illustrates an embodiment with a HBT and a BAs subcollector.

FIG. 8 illustrates an HBT (Heterojunction Bipolar Transistor) cross-section. HBT 200 is mounted to fixture 202 using die bondline 204. Fixture 202 may be made of, for example, any machineable low resistance metal such as Kovar, A40, CuW, or even Al or Cu, and die bondline 204 may be made of, for example, metal eutectic solders or epoxies. In this example, subcollector 206 may be epitaxially grown from BAs or cubic BAs that is been doped with an N type dopant such as silicon, tellurium or another N type dopant to a concentration that is higher than a concentration used in collector layer 208. Layer 208 may be epitaxially grown from, for example, InP, InGaAs or InAlAs and may be in direct contact with subcollector layer 206. Layer 208 may be doped with an N type dopant such as silicon or tellurium. Base layer 210 is fabricated on top of collector layer 208 and may be in direct contact with layer 208. Base layer 210 may be epitaxially grown from, for example, InP, InGaAs or InAlAs, and may be doped with a P type dopant such as beryllium or carbon. Emitter layer 212 is fabricator on top of base layer 210 and may be in direct contact with base layer 210. Emitter layer 212 may be epitaxially grown from, for example, InP, InGaAs or InAlAs, and may be doped with an N type dopant such as silicon or tellurium. Collector contact 214 is electrically connected to subcollector layer 206. Base contact 216 is electrically connected base layer 210 and emitter contact 218 is electrically connected to emitter layer 212. Contacts 214, 216 and 218 may be fabricated by, for example, CVD or MBE using, for example, titanium, aluminum, chromium, copper or gold.

Hot-spot 220 illustrate how heat is spread by subcollector layer 206 and eventually transferred to fixture 202. The thermal conductivity of the BAs or cubic BAs of subcollector layer 206 enhances thermal management and thereby improves reliability of device 200.

It should be noted that the example of FIG. 8 was discussed with regard to a NPN transistor, but an embodiment of the present invention also applies to PNP transistors. For example, in the case of an PNP transistor, subcollector 206 is fabricated from BAs or cubic BAs that is been doped with a P type dopant such as beryllium, carbon, magnesium or another P type dopant to a concentration that is higher than a concentration used in collector layer 208. In this example, layer 208 may be fabricated from, for example, InP, InGaAs or InAlAs. Layer 208 may be doped with a P type dopant such as beryllium or carbon. Base layer 210 may be fabricated from, for example, InP, InGaAs or InAlAs and may be doped with an N type dopant such as silicon or tellurium. Emitter layer 212 may be fabricated from, for example, InP, InGaAs or InAlAs, and may be doped with a P type dopant such as beryllium or carbon.

In the above disclosed examples of FIG. 8, the non-BAs layers were fabricated from doped InP, InGaAs or InAlAs. In additional embodiments of the examples of FIG. 8, the non-BAs layers may be fabricated from doped GaAs, AlGaAs or InGaP.

Figure 9:
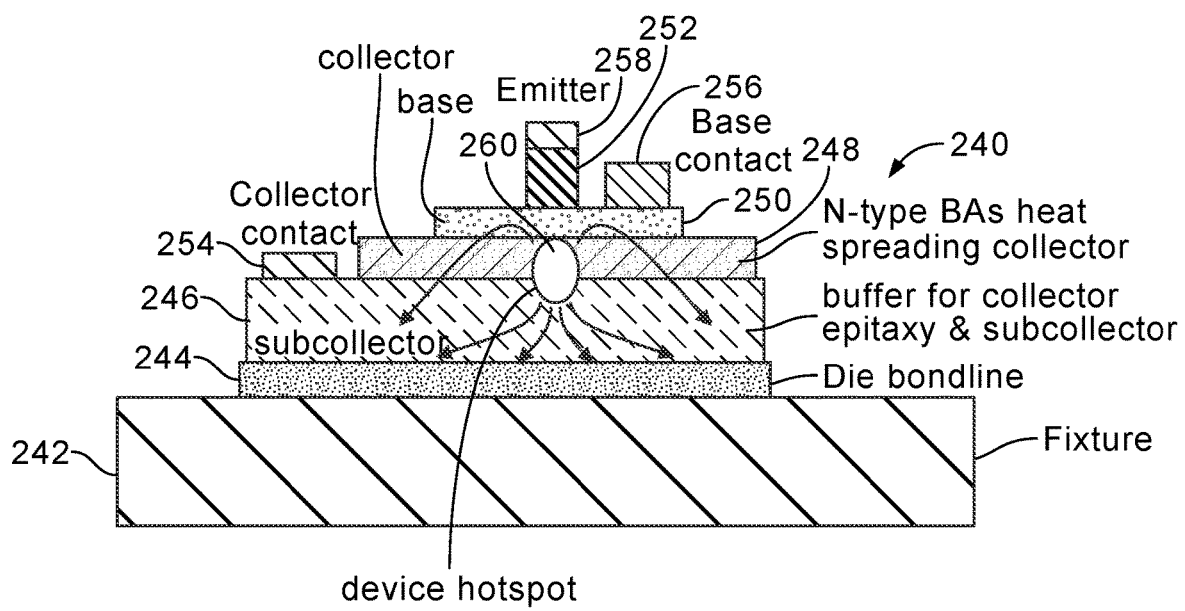
FIG. 9 illustrates an embodiment with a HBT and a BAs collector.

FIG. 9 illustrates an HBT cross-section. HBT 240 dismounted to fixture 242 using die bondline 244. Fixture 242 may be made of, for example, any machineable low resistance metal such as Kovar, A40, CuW, or even Al or Cu, and die bondline 244 may be made of, for example, metal eutectic solders or epoxies. In this example, subcollector layer 246 may be epitaxially grown from, for example, InP, InGaAs or InAlAs that is doped with an N type dopant such as silicon or tellurium to a concentration that is higher than a concentration used in collector layer 248. Layer 248 may be epitaxially grown from BAs or cubic BAs that is doped with an N type dopant such as silicon, tellurium or another N type dopant and may be in direct contact with subcollector layer 246. Base layer 250 as fabricated on top of collector layer 248 and may be in direct contact with layer 248. Base layer 250 may be epitaxially grown from, for example, InP, InGaAs or InAlAs that is doped with a P type dopant such as carbon or beryllium. Emitter layer 252 is fabricated on top of base layer 250 and may be in direct contact with base layer 250. Emitter layer 252 may be epitaxially grown from, for example, InP, InGaAs or InAlAs that is doped with an N type dopant such as silicon or tellurium. Collector contact 254 is electrically connected to subcollector layer 246. Base contact 256 is electrically connected base layer 250 and emitter contact 258 is electrically connected to emitter layer 252. Contacts 254, 256 and 258 may be fabricated by, for example, CVD or MBE using, for example, titanium, aluminum, chromium, copper or gold.

Hot-spot 260 illustrates how heat is spread by collector layer 248 and eventually transferred the fixture 242. The thermal conductivity of the BAs of collector layer 248 enhances thermal management and thereby improves reliability of device 240.

It should be noted that the example of FIG. 9 was discussed with regard to a NPN transistor, but an embodiment of the present invention also applies to PNP transistors. For example, in the case of an PNP transistor, collector layer 248 may be fabricated from BAs or cubic BAs that is doped with a P type dopant such as carbon, beryllium, magnesium or another P type dopant to a concentration that is lower than a concentration used in subcollector layer 246. In this example, layer 246 may be fabricated from, for example, InP, InGaAs or InAlAs. and is doped with a P type dopant such as carbon or beryllium. Base layer 250 may be fabricated from, for example, InP, InGaAs or InAlAs that is doped with an N type dopant such as silicon or tellurium. Emitter layer 252 may be fabricated from, for example, InP, InGaAs or InAlAs that is doped with a P type dopant such as carbon or beryllium.

In the above disclosed examples of FIG. 9, the non-BAs layers were fabricated from doped InP, InGaAs or InAlAs. In additional embodiments of the examples of FIG. 9, the non-BAs layers may be fabricated from doped GaAs, AlGaAs or InGaP.

Figure 10:
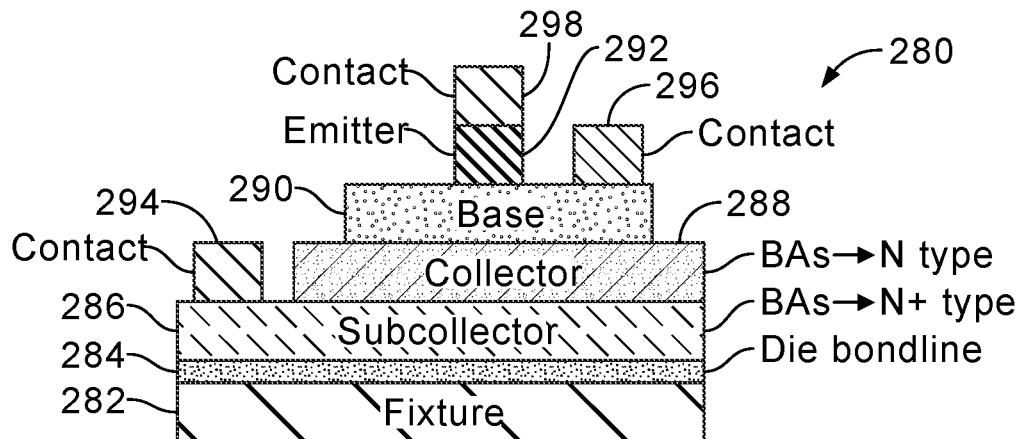
FIG. 10 illustrates an embodiment with a HBT and a BAs subcollector and collector.

FIG. 10 illustrates an HBT cross-section. HBT 280 is mounted to fixture 282 using die bondline 284. Fixture 282 may be made of, for example, any machineable low resistance metal such as Kovar, A40, CuW, or even Al or Cu, and die bondline 284 may be made of, for example, metal eutectic solders or epoxies. In this example, subcollector 286 may be epitaxially grown from BAs or cubic BAs that is doped with an N type dopant such as silicon, tellurium or another N type dopant to a concentration that is higher than a concentration used in collector layer 288. Layer 288 may be epitaxially grown from BAs or cubic BAs that is doped with an N type dopant such as silicon, tellurium or another N type dopant and may be in direct contact with subcollector layer 286. Base layer 290 may be epitaxially grown on top of collector layer 288 and may be in direct contact with layer 288. Base layer 290 may be fabricated from, for example, InP, InGaAs or InAlAs that is doped with a P type dopant such as carbon or beryllium. Emitter layer 292 is fabricated on top of base layer 290 and may be in direct contact with base layer 290. Emitter layer 292 may be epitaxially grown from, for example, InP, InGaAs or InAlAs that is doped with an N type dopant such as silicon or tellurium. Collector contact 294 is electrically connected to subcollector layer 286. Base contact 296 is electrically connected base layer 290 and emitter contact 298 is electrically connected to emitter layer 292. Contacts 294, 296 and 298 may be fabricated by, for example, CVD or MBE using, for example, titanium, aluminum, chromium, copper or gold.

It should be noted that the example of FIG. 10 was discussed with regard to a NPN transistor, but an embodiment of the present invention also applies to PNP transistors. For example, in the case of an PNP transistor, collector layer 288 may be fabricated from BAs or cubic BAs that is doped with a P type dopant such as carbon, beryllium, magnesium or another P type dopant to a concentration that is lower than the concentration of the P type dopant used in the BAs or cubic BAs of subcollector layer 286. The P type dopant used in subcollector layer 286 may be, for example, carbon, beryllium, magnesium or another P type dopant. In this example, base layer 250 may be fabricated from, for example, InP, InGaAs or InAlAs that is doped with an N type dopant such as silicon or tellurium. Emitter layer 252 may be fabricate from, for example, InP, InGaAs or InAlAs that is doped with a P type dopant such as carbon or beryllium.

In the above disclosed examples of FIG. 10, the non-BAs layers were fabricated from doped InP, InGaAs or InAlAs. In additional embodiments of the examples of FIG. 10, the non-BAs layers may be fabricated from doped GaAs, AlGaAs or InGaP.

Figure 11:
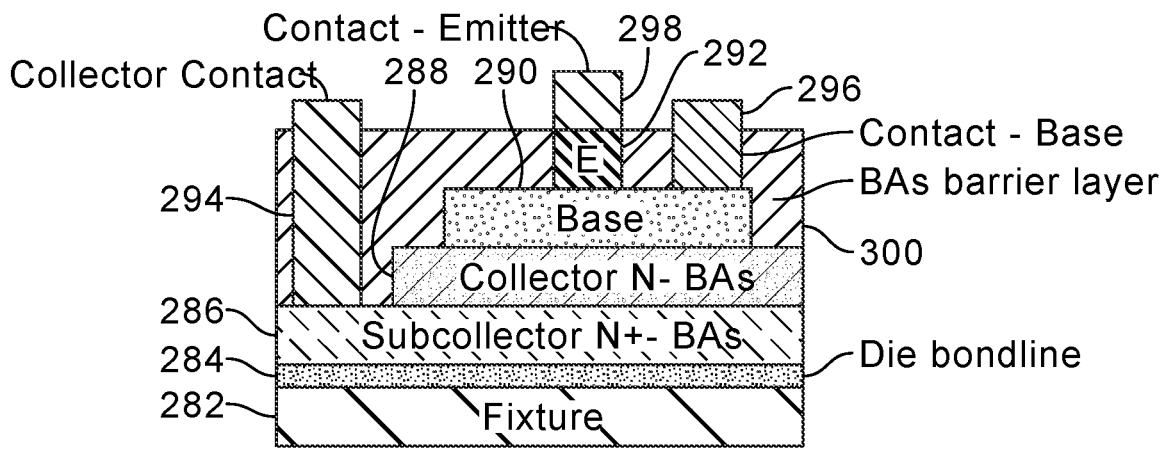
FIG. 11 illustrates an embodiment with a HBT and a BAs barrier layer contacting multiple other layers.

FIG. 11 illustrates the example of FIG. 10 with BAs or cubic BAs barrier layer 300 added. BAs layer 300 is an electrically insulating layer. It is in contact with the subcollector layer, the collector layer, the base layer and emitter layer. Layer 300 helps to dissipate heat as well as protect the other layers of the semiconductor device. In further embodiments of the present invention, this layer may be applied, for example, to the devices of FIGS. 8 and 9 as well.

Figure 12:
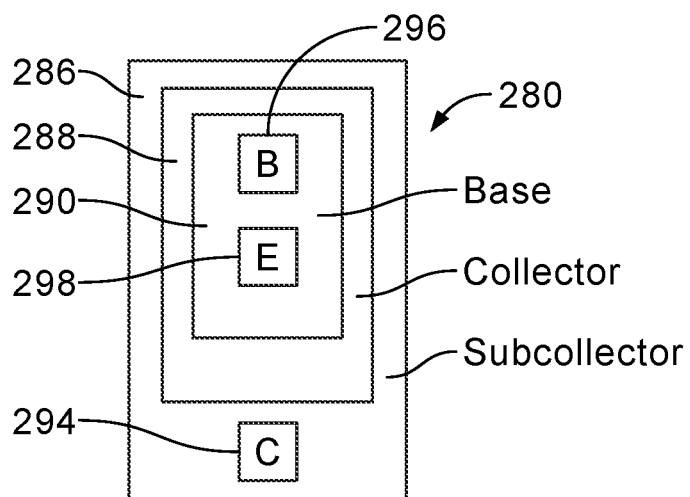
FIG. 12 illustrates a top view of an embodiment with a HBT and a BAs subcollector and collector.

FIG. 12 illustrates an example of a top view of the HBT of FIG. 10. Subcollector layer 286 is below collector layer 288, and collector layer 288 is below base layer 290. Base layer 290 is below emitter layer 292. Collector contact 294 is electrically connected to subcollector layer 286. Base contact 296 is electrically connected to base layer 290. Emitter contact 298 is electrically connected to emitter layer 292, which is positioned below contact 298 and above base layer 290.

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A semiconductor device, comprising:
   a substrate having a top surface and a bottom surface, the substrate comprising one or more of boron arsenide (BAs), sapphire, GaAs, and InP;
   a device buffer layer; and
   a first cubic boron arsenide (BAs) electrically insulating layer directly on top of a device channel layer, the device channel layer directly on top of the device buffer layer, wherein the device buffer layer is between the top surface of the substrate and the device channel layer, and wherein the cubic BAs electrically insulating layer is in thermal contact with the device buffer layer and the device channel layer, the cubic BAs electrically insulating layer providing improved thermal conductivity while having a coefficient of thermal expansion (CTE) matching a CTE of one or more of sapphire, GaAs, and InP, the cubic BAs electrically insulating layer removing heat from one or more of the device channel layer and the device buffer layer, the device channel layer comprising a hot-spot, the hot-spot configured to remove heat from the device channel layer and from the device buffer layer.

2. The device of claim 1, wherein the cubic BAs electrically insulating layer removes heat from both the device channel layer and the device buffer layer.

3. The device of claim 1, wherein the cubic BAs electrically insulating layer spreads heat throughout the cubic BAs electrically insulating layer.

4. A semiconductor device, comprising:
a substrate having a top surface and a bottom surface, wherein the substrate comprises at least one via through the bottom surface and into the substrate, and wherein the at least one via contains cubic boron arsenide (BAs), wherein the cubic BAs in the at least one via contacts a first cubic BAs electrically insulating layer, wherein the at least one via has one or more of a cylinder shape, a square pyramid shape, a hemisphere shape, a paraboloid shape, a cube shape, a cone shape, a tetrahedron shape, a triangular prism shape, a truncated cylinder shape, a truncated square pyramid shape, a truncated hemisphere shape, a truncated paraboloid shape, a truncated cube shape, a truncated cone shape, a truncated tetrahedron shape, and a truncated triangular prism shape;
the first cubic BAs electrically insulating layer on the top surface of the substrate, the first cubic BAs electrically insulating layer providing improved thermal conductivity while having a coefficient of thermal expansion (CTE) matching a CTE of one or more of sapphire, GaAs, and InP;
a device buffer layer directly on top of the first cubic BAs electrically insulating layer; and
a device channel layer directly on top of the device buffer layer, the first cubic BAs electrically insulating layer removing heat from one or more of the device buffer layer and the device channel layer, the device channel layer comprising a hot-spot, the hot-spot configured to remove heat from the device channel layer and from the device buffer layer.

5. The device of claim 4, further comprising a second cubic BAs electrically insulating layer on top of the device channel layer.

6. The device of claim 4, wherein the cubic BAs in the at least one via fills the at least one via.

7. The device of claim 4, wherein the bottom surface of the substrate has a BAs layer.

8. The device of claim 4, wherein the BAs layer on the bottom surface of the substrate contacts the BAs in the at least one via.

9. The device of claim 4, wherein in the at least on via has a surface to volume ratio of greater than 10.

10. The device of claim 3, further comprising a cubic BAs layer on top of the device channel layer.

11. The device of claim 4, wherein the cubic BAs electrically insulating layer removes heat from both the device buffer layer and the device channel layer.

12. A semiconductor device, comprising:
a first layer having a first layer conductive contact and being doped at a first concentration of a first dopant type, the first dopant type being an N type dopant;
a second layer directly on top of the first layer and being doped at a second concentration of the first dopant type, the second concentration being less than the first concentration, the second layer comprising a hot-spot, the hot-spot configured to remove heat from one or more of the second layer and the first layer;
a third layer directly on top of the second layer and having a third layer conductive contact and being doped with a second dopant type, the second dopant type being a P type dopant; and
a fourth layer directly on top of the third layer and having a fourth layer conductive contact and being doped with the first dopant type, wherein at least one of the first layer and the second layer is a cubic boron arsenide (BAs) layer, the cubic BAs layer providing improved thermal conductivity while having a coefficient of thermal expansion (CTE) matching a CTE of one or more of sapphire, GaAs, and InP, the cubic BAs layer removing heat from one or more of the third layer and the fourth layer.

13. The device of claim 12, wherein the first layer is the cubic BAs layer.

14. The device of claim 12, wherein the second layer is the cubic BAs layer.

15. The device of claim 12, wherein both the first layer and the second layer are cubic BAs layers.

16. The device of claim 12, further comprising a cubic BAs electrically insulating layer in contact with the first layer, the second layer, the third layer and the fourth layer.

17. The device of claim 16, wherein the first layer is the cubic BAs layer.

18. The device of claim 16, wherein the second layer is the cubic BAs layer.

19. The device of claim 16, wherein both the first and second layers are cubic BAs layers.

20. The device of claim 12, wherein the cubic BAs layer removes heat from both the third layer and the fourth layer.

* * * * *

UNITED STATES PATENT AND TRADEMARK OFFICE
CERTIFICATE OF CORRECTION

PATENT NO. : 11,488,889 B1
APPLICATION NO. : 15/671432
DATED : November 1, 2022
INVENTOR(S) : John A. Starkovich et al.

It is certified that error appears in the above-identified patent and that said Letters Patent is hereby corrected as shown below:

In the Claims

Column 10, Claim 8, Line 3, please delete "4", and insert --7--.

Column 10, Claim 10, Line 8, please delete "3", and insert --4--.

Signed and Sealed this
Seventh Day of February, 2023

Katherine Kelly Vidal
*Director of the United States Patent and Trademark Office*